United States Patent
Jeong et al.

(10) Patent No.: US 8,432,758 B2
(45) Date of Patent: Apr. 30, 2013

(54) DEVICE AND METHOD FOR STORING ERROR INFORMATION OF MEMORY

(75) Inventors: Woo-Sik Jeong, Gyeonggi-do (KR); Kang-Chil Lee, Gyeonggi-do (KR); Jeong-Ho Cho, Gyeonggi-do (KR); Kyoung-Shub Lee, Gyeonggi-do (KR); Il-Kwon Kang, Gyeonggi-do (KR); Sungho Kang, Seoul (KR); Joo Hwan Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 159 days.

(21) Appl. No.: 12/982,705

(22) Filed: Dec. 30, 2010

(65) Prior Publication Data

US 2012/0127813 A1 May 24, 2012

(30) Foreign Application Priority Data

Nov. 23, 2010 (KR) ........................ 10-2010-0116819

(51) Int. Cl.
*G11C 29/00* (2006.01)

(52) U.S. Cl.
USPC .................. 365/200; 365/185.05; 365/230.06

(58) Field of Classification Search .................. 365/200, 365/185.05, 230.06, 49, 189.02, 189.05, 365/189.07, 189.08, 230.02, 230.08
See application file for complete search history.

(56) References Cited

U.S. PATENT DOCUMENTS

| | | | | |
|---|---|---|---|---|
| 6,928,591 | B2 * | 8/2005 | Grinchuk et al. | 714/710 |
| 2002/0159310 | A1 * | 10/2002 | Park et al. | 365/200 |
| 2009/0225596 | A1 * | 9/2009 | Shin et al. | 365/185.05 |

FOREIGN PATENT DOCUMENTS

| | | |
|---|---|---|
| JP | 2001043698 | 2/2001 |
| KR | 1020010076937 | 8/2001 |
| KR | 1020080110710 | 12/2008 |

OTHER PUBLICATIONS

Shyue-Kung Lu et al., "Efficient Built-In Redundancy Analysis for Embedded Memories With 2-D Redundancy,".
IEEE Transactions on Very Large Scale Integration(VLSI) Systems, Jan. 2006, pp. 34-42, vol. 14, No. 1.
John R. Day, "A Fault-Driven, Comprehensive Redundancy Algorithm," International Test Conference, Jun. 1985, pp. 35-44.
Chih-Tsum Huang et al., "Bulit-In Redundancy Analysis for Memory Yield Improvement,".
IEEE Transactions on Reliability, Dec. 2003, pp. 386-399, vol. 52, No. 4.
Swapnil Bahl, "A Sharable Built-in Self-repair for Semiconductor Memories with 2-D Redundancy Scheme,".
22nd IEEE International Symposium on Defecct and Fault Tolerance in VLSI Systems, 2007, pp. 331-339.

(Continued)

*Primary Examiner* — Dang Nguyen
(74) *Attorney, Agent, or Firm* — IP & T Group LLP

(57) ABSTRACT

A device for storing error information of a memory device includes a plurality of parent memories and a plurality of child memories. Each of the parent memories stores a row address and a column address of one defective cell. Each of the child memories stores a column address of a defective cell, having a row address identical to a row address stored in the corresponding parent memory, or a row address of a defective cell, having a column address identical to a column address stored in the corresponding parent memory. Herein, each of the parent memories stores information about information about whether a row repair must be performed to repair a defective cell stored in the parent memory and information about whether a column repair must be performed to repair a defective cell stored in the parent memory.

17 Claims, 7 Drawing Sheets

OTHER PUBLICATIONS

Tsu-Wei Tseng et al., "A Reconfigurable Built-In Self-Repair Scheme for Multiple Repairable RAMs in SOCs," International Test Conference, 2006, pp. 1-9, Paper 30.2.

Yu-Jen Huang et al., "A Built-In Redundancy-Analysis Scheme for Self-Repairable RAMs with Two-Level Redundancy,".

21st IEEE International Symposium on Defecct and Fault-Tolerance in VLSI Systems, 2006, pp. 1-9.

Philipp Ohler et al., "An Integrated Built-in Test and Repair Approach for Memories with 2D Redundancy," 12th IEEE European Test Sysmposium, 2007.

Hung-Yau Lin et al., "An Efficient Alorithm for Spare Allocation Problems," IEEE Transactions on Reliability, Jun. 2006, pp. 369-378, vol. 55, No. 2.

Shyue-Kung Lu et al., "A BIRA Algorithm for Embedded Memories with 2-D Redundancy," IEEE International Workshop on Memory Technology, Design and Testing, 2005.

Shyue-Kung Lu et al., "Efficient BISR Techniques for Word-Oriented Embedded Memories with Hierarchical Redundancy," IEEE/ACIS International Conference on Computer and.

Information Science and 1st IEEE/ACIS International Workshop on Component-Based Software Engineering, Software Architecture and Reuse, 2006.

Rei-Fu Huang et al., "Economic Aspects of Memory Built-in Self-Repair," IEEE Design & Test of Computers, Mar.-Apr. 2007 pp. 164-172.

Woosik Jeong et al., "A Fast Built-in Redundancy Analysis for Memories With Optimal Repair Rate Using a Line-Based Search Tree,".

IEEE Transactions on Very Large Scale Integration(VLSI) Systems, Dec. 2009, pp. 1665-1678, vol. 17, No. 12.

Tsu-Wei Tseng et al., "ReBISR: A Reconfigurable Built-In Self-Repair Scheme for Random Access Memories in SOCs,".

IEEE Transactions on Very Large Scale Integration(VLSI) Systems, Jun. 2010, pp. 921-932, vol. 18, No. 6.

M. Tarr et al., "Defect Analysis System Speeds Test and Repair of Redundant Memories," Jan. 12, 1984, pp. 175-179.

Tomoya Kawagoe et al., "A Built-In Self-Repair Analyzer (CRESTA) for Embedded DRAMs," ITC International Test Conference, 2000, pp. 567-574.

Tsu-Wei Tseng et al., "A Built-In Redundancy-Analysis Scheme for RAMs with 2D Redundancy Using 1D Local Bitmap,".

Sy-Yen Kuo et al., "Efficient Spare Allocation in Reconfigurable Arrays," 23rd Design Automation Conference, 1986, pp. 385-390, Paper 23.3.

Wei Kang Huang et al., "New Approaches for the Repairs of Memories with Redundancy by Row/Column Deletion for Yield Enhancement,".

IEEE Transactions on Computer-Aided Dessign, Mar. 1990, pp. 323-328, vol. 9, No. 3.

Douglas M. Blough et al., "Performance Evaluation of a Reconfiguration-Algorithm for Memory Arrays containing Clustered Faults,".

IEEE Transactions on Reliability, Jun. 1996, pp. 274-284, vol. 45, No. 2.

Ran Libeskind-Hadas et al., "Fast Search Algorithms for Reconfiguration Problems," IEEE, 1991, pp. 260-273.

Osamu Wada et al., "Post-Packaging Auto Repair Techniques for Fast Row Cycle Embedded DRAM," ITC International Test Conference, 2004, pp. 1016-1023, Paper 35.4.

Kostas Pagiamtzis et al., "Content-Addressable Memory (CAM) Circuits and Architectures: A Tutorial and Survey," IEEE Journal of Solid-State Circuits, Mar. 2006, pp. 712-727, vol. 41, No. 3.

"Built-in Repair Analysis," Fall workshop 2010, Korea Test Conference, Oct. 20, 2010.

Woosik Jeong et al., "An Advanced BIRA for Memories with an Optimal Repair Rate and Fast Analysis Speed by Using a Branch Analyzer,".

IEEE Transactions on Computer-Aided Design of Integrated Circuits and Systems, Dec. 2010, pp. 2014-2026, vol. 29, No. 12.

Office Action issued by the Korean Intellectual Property Office on Mar. 19, 2012.

Notice of Allowance issued by the Korean Intellectual Property Office on Nov. 22, 2012.

* cited by examiner

| | COLUMN | | | | | | | | |
|---|---|---|---|---|---|---|---|---|---|
| | | 0 | 1 | 2 | 3 | 4 | 5 | 6 | 7 |
| ROW | 0 | | | | ○#4 | | | | |
| | 1 | | | | | | ○#8 | | |
| | 2 | ○ | | ○ | | | | | |
| | 3 | #5 | | #6 | | | | | |
| | 4 | | | | | | | #7 | |
| | 5 | ○ | | | ○ | | | ○ | |
| | 6 | #1 | | | #2 | | ○#3 | | |
| | 7 | | | | | | | | |

2 REDUNDANCY COLUMNS (right and bottom)

DEFECTIVE CELL DETECTION ORDER — (ROW, COLUMN)

| | (ROW, COLUMN) |
|---|---|
| #1 | (5,0) |
| #2 | (5,3) |
| #3 | (6,5) |
| #4 | (0,3) |
| #5 | (2,0) |
| #6 | (2,2) |
| #7 | (5,6) |
| #8 | (1,5) |

DEVICE AND METHOD FOR STORING ERROR INFORMATION OF MEMORY

CROSS-REFERENCE(S) TO RELATED APPLICATIONS

The present application claims priority of Korean Patent Application No. 10-2010-0116819, filed on Nov. 23, 2010, which is incorporated herein by reference in its entirety.

BACKGROUND OF THE INVENTION

Exemplary embodiments of the present invention relate to semiconductor memory devices, and more particularly, to a device and method for storing error information in a memory device, which is applicable to any semiconductor memory chip.

In the early stage of the memory semiconductor industry, a larger number of original good dies, which had no defective cell in a memory chip that passed through a semiconductor fabrication process, were distributed on a wafer. However, as the memory capacity has increased, it has become difficult to fabricate a memory chip without a defective cell. At the present time, there is a small chance that a memory chip will be fabricated without a defective cell.

In order to overcome this limitation, a method for replacing a defective memory cell with a spare memory cell (i.e., a redundancy memory cell) has been proposed. In order to replace a defective memory cell with a redundancy memory cell, a solution thereof must be calculated by using external equipment. Research is being conducted to install such a repair circuit (i.e., a memory self-repair circuit) in a memory chip.

Three main parameters to be considered for a memory self-repair circuit may be an area, a repair rate, and an analysis speed of a repair circuit. The area is a parameter connected directly with the semiconductor chip fabrication cost. The repair rate is an important parameter connected with the yield of a semiconductor device. The analysis speed of a repair circuit may also be regarded as a parameter connected directly with the semiconductor chip fabrication cost, because it is proportional to a test time.

A repair most method is disclosed in the prior art (e.g., M. Tarr, D. Boudreau, and R. Murphy, "Defect analysis system speeds test and repair of redundant memories", Electronics, vol. 57, pp. 175-179, Jan. 12, 1984). A repair most method stores the number of defective cells of each row/column address detected during a test process, compares the number of defective cells of each row/column address after completion of the test process, and replaces a defective memory cell with a redundancy memory cell in descending order of the number of defects at an address. However, the repair most method of the prior art utilizes a large area because it requires a large-capacity buffer for storing a defective bit map. Also, the repair most method of the prior art may have a long defect analysis/repair time because it can perform a defect repair operation only after completion of a test process.

A local repair most method is also disclosed in the prior art (e.g., C.-T. Huang, C.-F. Wu, J.-F. Li, and C.-W. Wu, "Built-in Redundancy Analysis for Memory Yield Improvement", IEEE Trans. Reliability, vol. 52, pp. 386-399, December 2003). The local repair most method of the prior art uses a small-sized defect bit map to reduce the area while applying a method similar to the repair most method. However, the local repair most method of the prior art cannot store all information for efficient repairs due to a small-sized bit map, and cannot repair more than a predetermined number of defects due to insufficient information stored (i.e., cannot repair defects due to insufficient information even in the case of sufficient redundancy memory), thus reducing the repair rate.

Also, an essential spare pivot method has been disclosed. The essential spare pivot method stores only core defect addresses instead of a defect bit map in order to reduce the area. Therefore, a defect address collecting process is performed during a test process, thus improving the analysis speed of a self-test circuit. However, a register capacity for storing defect addresses is insufficient, thus reducing the repair rate.

SUMMARY OF THE INVENTION

Exemplary embodiments of the present invention are directed to a defect address storing device that can store all information regarding defective cells in a reduced area.

Exemplary embodiments of the present invention are also directed to a device and method for storing error information of a memory device, which can improve the analysis speed of a self-repair circuit including a defect address storing device by storing defective cell addresses in the defect address storing device in real time during a test process.

In accordance with an exemplary embodiment of the present invention, a device for storing error information of a memory device includes a plurality of parent memories each storing a row address and a column address of one defective cell and a plurality of child memories each storing a column address of a defective cell, having a row address identical to a row address stored in the corresponding parent memory, or storing a row address of a defective cell, having a column address identical to a column address stored in the corresponding parent memory, wherein each of the parent memories stores first information about whether a row repair must be performed to repair a defective cell stored in the parent memory and second information about whether a column repair must be performed to repair a defective cell stored in the parent memory.

The first information stored in each of the parent memories may indicate a row repair must be performed when the number of defective cells with the same row address exceeds the number of redundancy columns. The second information stored in each of the parent memories may indicate a column repair must be performed when the number of defective cells the same column address exceeds the number of redundancy rows.

In accordance with another exemplary embodiment of the present invention, a device for storing error information of a memory device includes a plurality of parent memories each storing a column address, a row address, a column must-repair flag for the column address and a row must-repair flag for the row address and a plurality of child memories each storing an address, address information indicating whether the address is a row address or a column address and pointer information indicating which one of the parent memories correspond to the child memory.

The column must-repair flag may be activated if the number of defective cells with the same column address exceeds the number of redundancy rows. The row must-repair flag may be activated if the number of defective cells the same row address exceeds the number of redundancy columns.

In accordance with still another exemplary embodiment of the present invention, a method for storing error information of a memory device in a fault information storing device including a plurality of parent memories and a plurality of child memories, includes ignoring a defective cell if the defective cell belongs to a row or a column classified as a must repair, indicating that the row or column has been classified as a must repair in the parent memory storing the row or column, if the row or column of the defective cell is to be classified as a new must repair, and storing information about the defective cell in one of the parent memories or one of the child memories if the ignoring and the indicating operations are not performed.

The indicating operation may include activating a row must-repair flag of the parent memory storing the row of the defective cell if the number of defective cells belonging to the row exceeds the number of redundancy columns, and activating a column must-repair flag of the parent memory storing the column of the defective cell if the number of defective cells belonging to the column exceeds the number of redundancy rows.

In accordance with yet another exemplary embodiment of the present invention, a memory device includes a memory cell array, comprising a plurality of memory cells arranged in rows and columns, and a fault information storing device configured to store row addresses and column addresses of defective memory cells and to store a row must-repair flag and a column must-repair flag.

BRIEF DESCRIPTION OF THE DRAWINGS

FIG. 1 illustrates defective cells in a memory device including 8 rows and 8 columns.

FIG. 4 illustrates defective cells detected in a memory device, which includes 8 rows and 8 columns and includes 2 redundancy rows (Rs) and 2 redundancy columns (Cs), and the detection order of the defective cells.

DESCRIPTION OF SPECIFIC EMBODIMENTS

Figure 2:
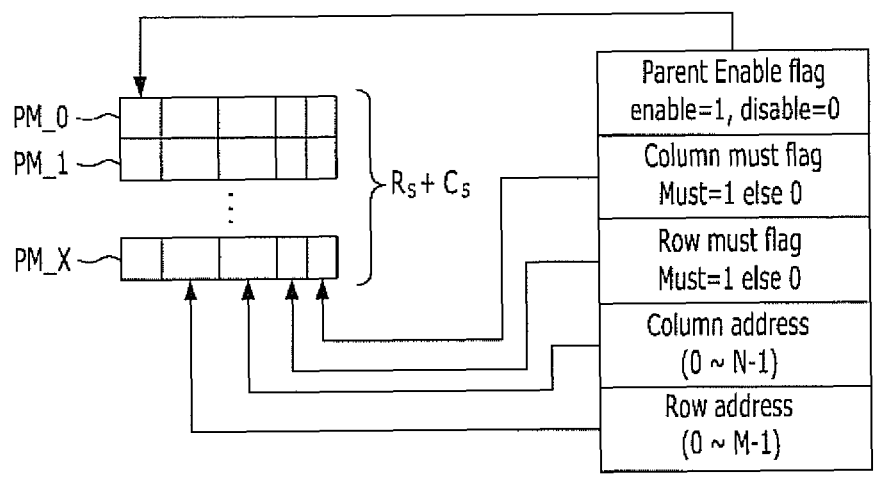
FIG. 2 illustrates a fault information storing device in accordance with an exemplary embodiment of the present invention.
Figure 2:
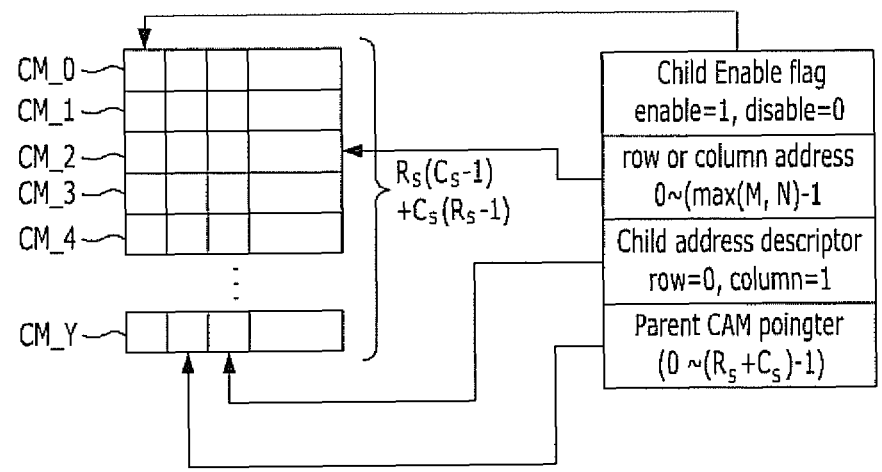

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

First, a repair rate and a defect classification method will be described for a better understanding of the present invention.

A. Repair Rate

A repair rate is defined as Equation 1.

$$\text{Repair Rate} = \frac{\text{Number of Repaired Chips}}{\text{Number of Repairable Chips}} \qquad \text{Eq. 1}$$

The optimal repair rate is 100%. The repair rate becomes 100% if one or more solutions can be found whenever a defect is repairable. In Equation 1, the denominator is the number of repairable chips. Therefore, the impossibility of finding a solution for an unrepairable case (i.e., the case where the number of defects exceeds the number of defects that can be covered by redundancy memory cells) does not affect the repair rate. In order to increase the repair rate, a fault information storing device preferably stores all information for a repair operation.

Figure 1:
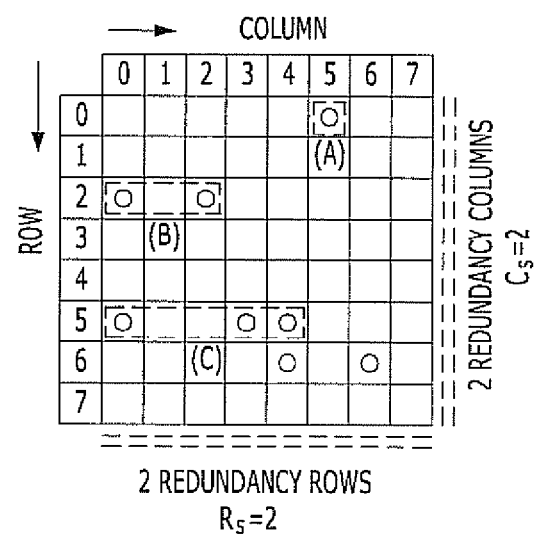

FIG. 1 illustrates defective cells in a memory device including 8 rows and 8 columns. Classification of defects is described below with reference to FIG. 1.

Reference character 'Rs' denotes the number of redundancy rows, and reference character 'Cs' denotes the number of redundancy columns. Hereinafter, it is assumed that Rs=2 and Cs=2.

B. Classification of Defects (1) Single Fault

A single fault refers to the case when there is no other defective cell at a column address and a row address where a defective cell is located. Referring to FIG. 1, a defective cell A located at row 0 and column 5 is classified as a single fault because there are no other defective cells in row 0 and no other defective cells in column 5.

A single fault may be repaired by replacing it with one redundancy row or one redundancy column. For example, the defective cell A of FIG. 1 may be repaired by replacing row 0 with a redundancy row or replacing column 5 with a redundancy column.

(2) Sparse Faulty Line

When there are k (where $1<k\leq Cs$) defective cells at a row address, the k defective cells are collectively referred to as a row line fault. Also, when there are j (where $1<j\leq Rs$) defective cells at a column address, the j defective cells are collectively referred to as a column line fault. Thus, the defective cells B of FIG. 1 are classified as a row line fault.

A row line fault may be repaired by replacing the k defective cells with one redundancy row or k redundancy columns. Also, a column line fault may be repaired by replacing the j defective cells with one redundancy column or j redundancy rows. For example, the defective cells B of FIG. 1 may be repaired by replacing row 2 with a redundancy row or replacing columns 0, 1, and 2 with redundancy columns.

(3) Must-Repair Faulty Line

When there are k (where k>Cs) defective cells at a row address, the k defective cells are collectively referred to as a row must-repair fault line (or a must-repair faulty row line). Also, when there are j (where j>Rs) defective cells at a column address, the j defective cells are collectively referred to as a column must-repair fault line (or a must-repair faulty column line). Thus, the defective cells C of FIG. 1 are classified as a row must-repair fault line because the number of defective cells with the same row address (e.g., row 5) is 3, which is greater than the number of redundancy columns Cs, which is 2.

A row must-repair fault line must be repaired by replacing it with a redundancy row. Likewise, a column must-repair fault line must be repaired by replacing it with a redundancy column. For example, the defective cells C of FIG. 1 must be repaired by replacing row 5 with a redundancy row.

FIG. 2 illustrates a fault information storing device in accordance with an exemplary embodiment of the present invention.

Referring to FIG. 2, a fault information storing device in accordance with an exemplary embodiment of the present invention includes a plurality of parent memories PM_0-PM_X and a plurality of child memories CM_0-CM_Y. Each of the parent memories PM_0-PM_X stores a column address and a row address of one defective cell, and also stores information about whether a row repair is needed to repair a defective cell stored in the parent memory (i.e., whether a row must-repair fault line exists) and information about whether a column repair must be needed to repair a defective cell stored in the parent memory (i.e., whether a column must-repair fault line exists). Each of the child memories CM_0-CM_Y stores a column address of a defective cell having a row address identical to the row address stored in the corresponding parent memory, or stores a row address of a defective cell having a column address identical to the column address stored in the corresponding parent memory.

Each of the parent memories PM_0-PM_X stores information about a defective cell having no overlapping address among the row addresses and the column addresses of the defective cells stored in another parent memory, among the defective cells detected as a result of a test process. For example, if an address of row 0 and column 3 is not stored in another parent memory at the time of detection of a defective cell at row 0 and column 3, the address of the defective cell at row 0 and column 3 is stored in a parent memory. Further, if the detected defective cell belongs to a must-repair faulty line, the parent memory also stores information thereof.

Information stored in the parent memory is described below with reference to FIG. 2.

Parent Enable Flag:

A parent enable flag indicates whether the address stored in the corresponding parent memory is valid or not. If the parent enable flag is '1', the address stored in the corresponding parent memory is valid; and if the parent enable flag is '0', the address stored in the corresponding parent memory is invalid. Here, the parent enable flag occupies a 1-bit storage space.

Row Address:

A row address of a defective cell is stored in a corresponding parent memory. A storage space necessary to store the row address varies according to the number of bits of the row address. For example, if the row address is comprised of 10 bits, a 10-bit storage space is necessary to store the same. In FIG. 2, M denotes the number of all rows. If M is 1024, the row address may be comprised of 10 bits ($\log_2 1024$).

Column Address:

A column address of a defective cell stored in a corresponding parent memory. A storage space necessary to store the column address varies according to the number of bits of the column address. For example, if the column address is comprised of 10 bits, a 10-bit storage space is necessary to store the same. In FIG. 2, N denotes the number of all columns. If N is 512, the column address may be comprised of 9 bits ($\log_2 2512$).

Row Must Flag:

A row must flag indicates whether a row, having the row address stored in the corresponding parent memory, contains defective cells that are classified as a row must-repair fault line. If the row must flag is '1', it indicates that a row must-repair fault line exists at a particular row address; and if the row must flag is '0', it indicates that a row must-repair fault line does not exist at a particular row address. Here, the row must flag occupies a 1-bit storage space.

Column Must Flag:

A column must flag indicates whether a column, having the column address stored in the corresponding parent memory, contains defective cells that are classified as a column must-repair fault line. If the column must flag is '1', it indicates that a column must-repair fault line exists at a particular column address; and if the column must flag is '0', it indicates that a column must-repair fault line does not exist at a particular column address. Here, the column must flag occupies a 1-bit storage space.

The parent memories PM_0-PM_X are as many as the total redundancy number, i.e., Rs+Cs. The number of defective cells that all the parent memories PM_0-PM_X can record is equal to the total redundancy number. If the number of defective cells to be recorded in the parent memories PM_0-PM_X is greater than Rs+Cs, the memory is classified as unrepairable memory.

The child memories CM_0-CM_Y correspond to one of the parent memories PM_0-PM_X, respectively. Each of the child memories CM_0-CM_Y shares a column address or a row address with its corresponding parent memory PM_0-PM_X. Further, each of the child memories CM_0-CM_Y may store information about a defective cell, which belongs to a faulty line (e.g., sparse faulty line or must-repair faulty line) with the column address or the row address stored in the parent memory PM_0-PM_X. If the row address of the detected defective cell is stored in any one of the parent memories PM_0-PM_X, information about the defective cell is stored in the child memory corresponding to the parent memory. Also, if the column address of the detected defective cell is stored in any one of the parent memories PM_0-PM_X, information about the corresponding defective cell is stored in the child memory corresponding to the parent memory. For example, if row 0 and column 3 is already stored in the parent memory PM_1, when a defective cell at row 0 and column 2 is detected, the column address of the defective cell (i.e., the column address corresponding to column 2) is stored in the child memory corresponding to the parent memory PM_1.

Information stored in the child memory is described below with reference to FIG. 2.

Child Enable Flag:

A child enable flag indicates whether the address stored in the corresponding child memory is valid or not. If the child enable flag is '1', the address stored in the corresponding child memory is valid; and if the child enable flag is '0', the address stored in the corresponding child memory is invalid. Here, the child enable flag occupies a 1-bit storage space.

Row or Column Address:

A row or column address of a defective cell is stored in a corresponding child memory. A storage space necessary to store the address is determined by the larger one of the number of bits of a row address and the number of bits of a column address. For example, if the row address is 9 bits and the column address is 10 bits, the storage space for storing the address occupies 10 bits in the child memory.

Address Information (Child Address Descriptor):

Address information indicates whether the address stored in the corresponding child memory is a row address or a column address. If the address information is '0', the address stored in the corresponding child memory is a row address; and if the address information is '1', the address stored in the corresponding child memory is a column address. Accordingly, the address information occupies a 1-bit storage space.

Pointer Information (Parent CAM Pointer):

Pointer information indicates the parent memory corresponding to the child memory storing the pointer information. For example, if the pointer information of a child memory is '4', it may indicate that the child memory corresponds to the parent memory PM_4. The number of bits of the pointer information is determined according to the number of parent memories PM_0-PM_X (number of parent memories=Rs+Cs). Specifically, the number of bits of the pointer information is equal to $\log_2(Rs+Cs)$.

The number of child memories CM_0-CM_X is equal to Rs(Cs−1)+Cs(Rs−1). Therefore, the sum of the number of parent memories PM_0-PM_X and the number of child memories CM_0-CM_X is 2×Rs×Cs. This sum represents the maximum number of defective cell addresses that can be stored to repair the memory with a given redundancy memory. Accordingly, the total number of bits of data to be stored by the parent memory and the child memory in accordance with the present invention is relatively small. Therefore, the area of the fault information storing device of the present invention is reduced as compared to that of the prior art.

The fault information storing device in accordance with the present invention classifies information about defective cells according to the row and column addresses of the defective cells. A defective cell stored in the parent memory with the assistance of a corresponding child memory belongs to a faulty line (i.e., sparse faulty line or must-repair faulty line). A defective cell stored in the parent memory without the assistance of a child memory corresponds to a single fault. Further, a defective cell stored in the parent memory storing an activated must-repair flag belongs to a must-repair faulty line.

Figure 3:
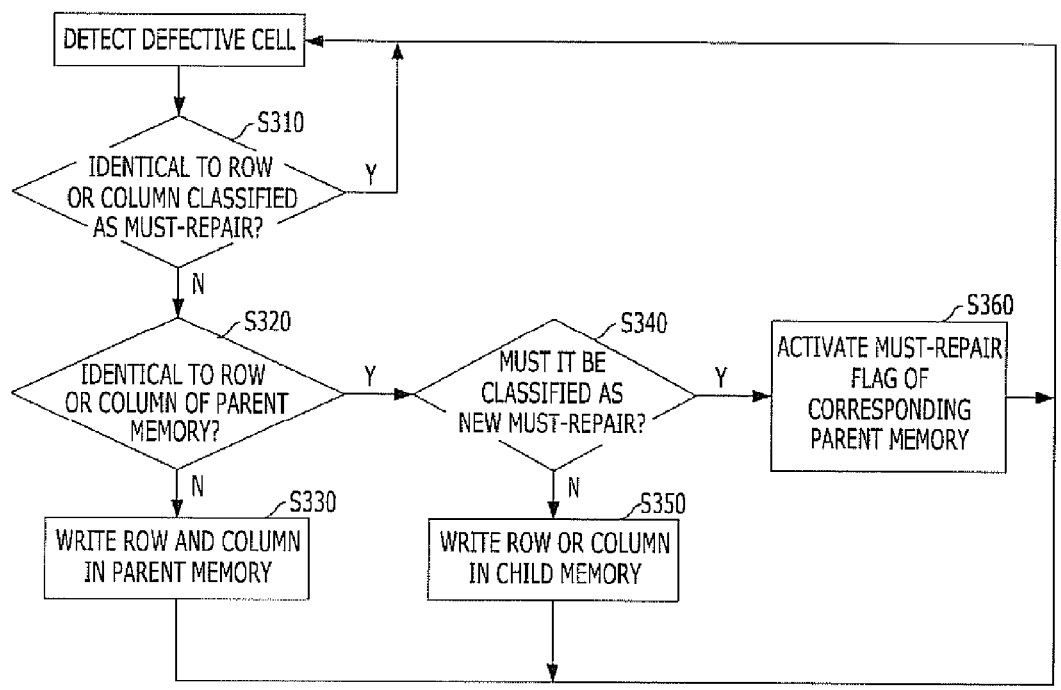
FIG. 3 is a flow diagram illustrating a method for storing error information in the fault information storing device of FIG. 2 in accordance with an exemplary embodiment of the present invention.

FIG. 3 is a flow diagram illustrating a method for storing error information in the fault information storing device of FIG. 2 in accordance with an exemplary embodiment of the present invention.

Referring to FIG. 3, when a defective cell is detected, it is determined whether the detected defective cell belongs to a row address classified as a must repair or a column address classified as a must repair (S310). If it is determined that the detected defective cell belongs to a must repair, information about the detected defective cell is ignored because it is no more necessary. That is, information about the defective cell detected at a column address or a row address classified as a must repair is not stored.

Thereafter, it is determined whether the address identical to the column address or the row address of the detected defective cell is already stored in the parent memory (S320). If the column address and the row address of the detected defective cell are not already stored in the parent memory, the column address and the row address of the detected defective cell are written in the parent memory (S330).

If one of the column address and the row address of the detected defective cell is already stored in the parent memory, it is determined whether the defective cell is to be classified as belonging to a new must-repair faulty line (S340). If the defective cell is to be classified as a new column must-repair faulty line or a new row must-repair faulty line, a must-repair flag of the parent memory corresponding to the detected defective cell (i.e., the parent memory storing the column address or the row address identical to that of the detected defective cell) is activated (S360). Herein, if the defective cell is classified as belonging to a column must-repair faulty line, a column must-repair flag is activated; and if the defective cell is classified as belonging to a row must-repair faulty line, a row must-repair flag is activated.

If the defective cell is not to be classified as belonging to a must-repair faulty line, then the column address or the row address of the detected defective cell is stored in the child memory (S350).

That is, in accordance with the present invention, if a defective is cell is detected, the detected defective cell is not ignored (i.e., path NO in S310 is taken), then one of three steps are performed: (1) the column address and the row address of the detected defective cell are stored in the parent memory (S330), (2) the must-repair flag of the parent memory is activated by the detected defective cell (S360), or (3) the column address or the row address of the detected defective cell are stored in the child memory (S350).

The process of FIG. 3 is repeated whenever a defective cell is detected.

Figure 5:
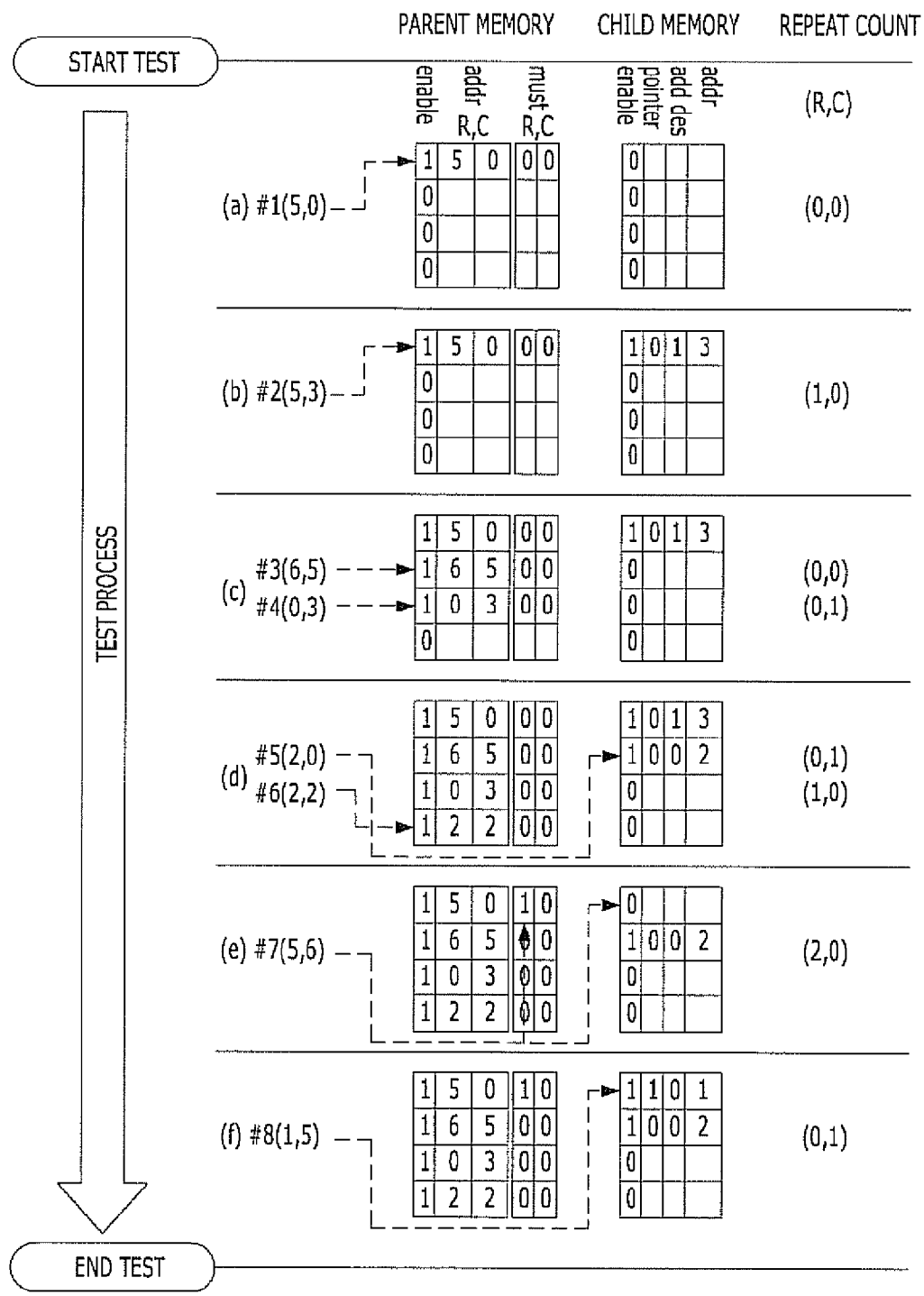
FIG. 5 illustrates a process of storing information about the defective cells, detected in the order of FIG. 4, in the fault information storing device in accordance with an exemplary embodiment of the present invention.

FIG. 4 illustrates an exemplary scenario in which defective cells detected in a memory device, which includes 8 rows and 8 columns and includes 2 redundancy rows (Rs) and 2 redundancy columns (Cs). FIG. 4 also includes a table showing an exemplary order in which the defective cells are detected. The table shows the order number and corresponding row and column address for the detected defective cells. FIG. 5 illustrates a process of storing information about the defective cells, detected in the order of FIG. 4, in the fault information storing device in accordance with an exemplary embodiment of the present invention. To aid in the description of the process of FIG. 5, FIG. 5 is divided into processes (a) through (f). A process of storing information about defective cells in the fault information storing device in accordance with an exemplary embodiment of the present invention is described below in detail with reference to FIGS. 4 and 5.

In FIG. 5, a repeat count value indicates the number of defective cells that have been previously detected at the same row address as the row address of the most recently detected defective cell and the number of defective cells detected that have been previously detected at the same column address as the column address of the most recently detected defective cell. The repeat count value is used to determine where (e.g., in parent memory or in child memory) information about a defective cell is to be stored. However, the repeat count value is not stored in the fault information storing device.

Referring to process (a) of FIG. 5, defective cell #1 is the first detected defective cell. The column address (0) and the row address (5) of defective cell #1 are compared with the column address and the row address stored in the parent memories PM_0-PM_3. However, because no column addresses or row addresses have been written in the parent memories PM_0-PM_3 at the time of detection of defective cell #1, the column address (0) and the row address (5) of defective cell #1 are written in the parent memory PM_0. Also, it can be seen from FIG. 5A that the parent enable flag of the parent memory PM_0 is written as '1', the row address ADDR R is written as '5', and the column address ADDR C is written as '0'.

Referring to process (b) of FIG. 5, when defective cell #2 is detected, the column address (3) and the row address (5) of defective cell #2 are compared with the column address and the row address stored in the parent memories PM_0-PM_3. Because the row address (5) of defective cell #2 is identical to the row address (5) written in the parent memory PM_0, the column address (3) of defective cell #2 is written in the child memory CM_0. The child enable flag of the child memory CM_0 is written as '1', the address ADDR is written as '3', and the address descriptor ADD DES is written as '1' to indicate that the written address is a column address. Also, the pointer information POINTER is written as '0' to indicate that the child memory CM_0 corresponds to the parent memory PM_0.

Referring to process (c) of FIG. 5, the column address (5) and the row address (6) of defective cell #3 are not identical to the row and column addresses that have been previously written in the parent memories PM_0-PM_3. Likewise, the column address (3) and the row address (0) of defective cell #4 are not identical to the row and column addresses that have been previously written in the parent memories PM_0-PM_3. Thus, the column address (5) and the row address (6) of defective cell #3 are written in the parent memory PM_1, and the column address (3) and the row address (0) of defective cell #4 are stored in the parent memory PM_2.

Referring to process (d) of FIG. 5, the column address (0) of defective cell #5 is identical to the column address (0) previously written in the parent memory PM_0. Thus, the row address (2) of defective cell #5 is stored in the child memory CM_1. The child enable flag ENABLE of the child memory CM_1 is written as '1', the address ADDR is written as '2', and the address descriptor ADD DES is written as '0' to indicate that the written address is a row address. Also, the pointer information POINTER is written as '0' to indicate that the child memory CM_1 corresponds to the parent memory PM_0. Because the column address (2) and the row address (2) of defective cell #6 are not identical to the row and column addresses previously written in the parent memories PM_0-PM_3, defective cell #6 is written in the parent memory PM_3.

Referring to process (e) of FIG. 5, the row address (5) of defective cell #7 is identical to the row address (5) written in the parent memory PM_0. Herein, it can be seen that the repeat count value is (2,0), which indicates that the number of defective cells detected previously at the row address (5) of defective cell #7 is 2. The number of defective cells detected at the same row address (5) (including defective cell #7) becomes 3, which exceeds the number of redundancy columns (Cs=2). Accordingly, each of defective cells #1, #2, and #7, sharing the row address (5), must be classified as belonging to a row must-repair faulty line. Thus, the row must-repair flag MUST R of the parent memory PM_0 is activated to T. Also, because information about defective cell #2 detected at the row address (5) does not need to be stored any more, the child enable flag ENABLE of the child memory CM_0 is deactivated to '0'.

Referring to process (f) of FIG. 5, the column address (5) of defective cell #8 is identical to the column address (5) written in the parent memory PM_1. Thus, the enable flag ENABLE of the child memory CM_0 is written as '1', the address ADDR is written as '1', the address descriptor ADD DES is written as '0' to indicate that the written address is a row address, and the pointer information POINTER is written as '1' to indicate that the child memory corresponds to the parent memory PM_1.

Through the processes (a) to (f) of FIG. 5, complete information for repairing the defective cells is stored in the fault information storing device. According to the information stored in the fault information storing device, the address of a row must-repair and the address of a column must-repair can be detected, and the locations of defective cells categorized as other faults than a must-repair faulty line (i.e., categorized as a single fault or belonging to a sparse faulty line) can be detected.

Accordingly, defective cells in must-repair faulty lines can be identified, so that they can be repaired without overly burdensome analysis. Also, because the locations of all defective cells categorized as a single fault or belonging to a sparse faulty line can be detected, the detected locations of the defective cells can be readily analyzed to determine how to repair the defective cells. Thus, the present invention can achieve a 100% repair rate by using the information stored in the fault information storing device.

Figure 6:
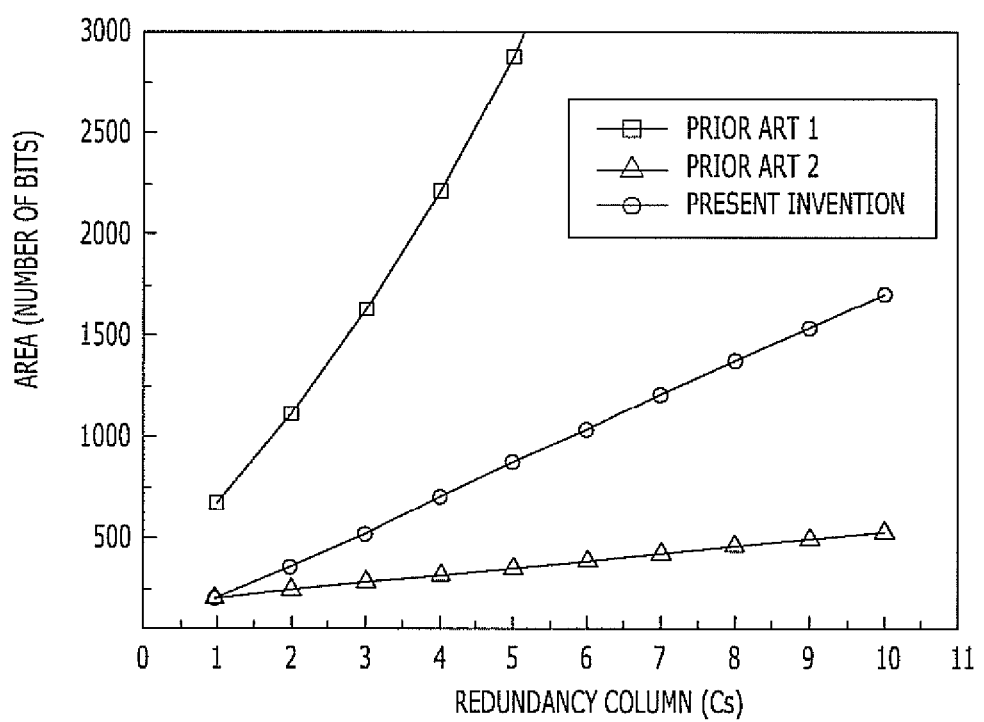
FIG. 6 illustrates the comparison between the area of a fault information storing device of the present invention and the areas of fault information storing devices of the prior art depending on a change in the number of redundancy rows (Rs).

FIG. 6 illustrates the comparison between the area of a fault information storing device of the present invention and the areas of existing fault information storing devices using a repair most method (prior art 1) and a local repair most method (prior art 2). More specifically, FIG. 6 shows the change in area depending on a change in the number of redundancy rows (Rs). Meanwhile, FIG. 7 illustrates the comparison between the area of a fault information storing device of the present invention and the areas of fault information storing devices of prior art 1 and prior art 2, depending on a change in the memory size.

For each of the present invention, prior art 1, and prior art 2, FIG. 6 illustrates the area of the fault information storing device that changes according to a change in the number of redundancy columns (Cs), in a case where the memory is comprised of 1024 rows×1024 columns and the number of redundancy rows (Rs) is 5. It can be seen from FIG. 6 that the fault information storing device of the present invention occupies a much smaller area than that of prior art 1. However, the fault information storing device of the present invention occupies a larger area than that of prior art 2. This is because prior art 2 omits storing information about defective cells, and therefore, cannot achieve a 100% repair rate.

Figure 7:
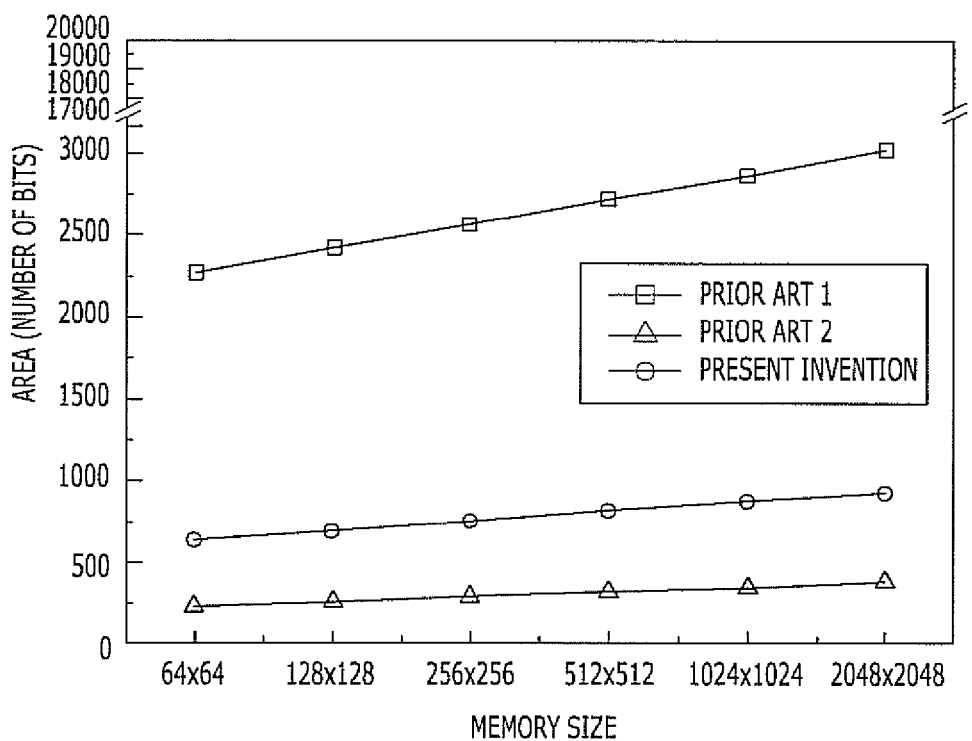
FIG. 7 illustrates the comparison between the area of a fault information storing device of the present invention and the areas of fault information storing devices of the prior art depending on a change in the memory size.

For each of the present invention, prior art 1, and prior art 2, FIG. 7 illustrates the area of the fault information storing device that changes according to a change in the memory capacity, in a case where the number of redundancy rows (Rs) is 5 and the number of redundancy columns (Cs) is 5. It can be seen from FIG. 7 that the fault information storing device of the present invention occupies a much smaller area than that of prior art 1.

For reference, the area of the fault information storing device of the present invention is calculated using Equation 2 below, the area of the fault information storing device of prior art 1 is calculated using Equation 3 below, and the area of the fault information storing device of prior art 2 is calculated using Equation 4 below. Herein, M denotes the number of rows of the memory, and N denotes the number of columns of the memory.

$$\text{Area}=(Rs+Cs)\times(\log_2 M+\log_2 N+3)+(Rs\times(Cs-1)+Cs\times(Rs-1))\times(\log_2(\max(M,N))-\log_2(Rs+Cs)+2) \quad \text{Eq. 2}$$

$$\text{Area}=m\times n+[(\log_2 M+1)+\log_2(n+1))]\times m+[(\log_2 N+1)+(\log_2(m+1))]\times n+A_{spare\_register}$$

where $m=(Rs(Cs+1)+Rs)$, $n=(Cs(Rs+1)+Cs)$, and $$A_{spare\_register}=[(\log_2 M+1)\times Rs+(\log_2 N+1)\times Cs] \quad \text{Eq. 3}$$

$$\text{Area}=(Rs+Cs)(\log_2 M+1+\log_2 N+1)+A_{spare\_register}$$

where $A_{spare\_register}=[(\log_2 M+1)\times Rs+(\log_2 N+1)\times Cs] \quad \text{Eq. 4}$ As described above, the repair information storing device and method according to the exemplary embodiments of the present invention can store all information necessary for a repair operation in a reduced area. Thus, the repair information storing device and method according to the exemplary embodiments of the present invention can increase the repair rate while reducing the circuit area.

While the present invention has been described with respect to the specific embodiments, it will be apparent to those skilled in the art that various changes and modifications may be made without departing from the spirit and scope of the invention as defined in the following claims.

What is claimed is:

1. A device for storing error information of a memory device, comprising:
    a plurality of parent memories each storing a row address and a column address of one defective cell; and
    a plurality of child memories each storing a column address of a defective cell, having a row address identical to a row address stored in the corresponding parent memory, or storing a row address of a defective cell, having a column address identical to a column address stored in the corresponding parent memory,
    wherein each of the parent memories stores first information about whether a row repair must be performed to repair a defective cell stored in the parent memory and second information about whether a column repair must be performed to repair a defective cell stored in the parent memory.

2. The device of claim 1, wherein the first information stored in each of the parent memories indicates a row repair must be performed when the number of defective cells with the same row address exceeds the number of redundancy columns.

3. The device of claim 1, wherein the second information stored in each of the parent memories indicates a column repair must be performed when the number of defective cells with the same column address exceeds the number of redundancy rows.

4. The device of claim 1, wherein each of the parent memories and each of the child memories store information indicating whether an address stored therein is valid.

5. A device for storing error information of a memory device, comprising:
    a plurality of parent memories each storing a column address, a row address, a column must-repair flag for the column address and a row must-repair flag for the row address; and
    a plurality of child memories each storing an address, address information indicating whether the address is a row address or a column address, and pointer information indicating which one of the parent memories corresponds to the child memory.

6. The device of claim 5, wherein
    each of the parent memories further stores parent valid information indicating whether the values stored therein are valid, and
    each of the child memories further stores child valid information indicating whether the values stored therein are valid.

7. The device of claim 5, wherein the column must-repair flag is activated when the number of defective cells with the same column address exceeds the number of redundancy rows.

8. The device of claim 7, wherein the row must-repair flag is activated when the number of defective cells with the same row address exceeds the number of redundancy columns.

9. The device of claim 5, wherein
    information about a defective cell is stored in one of the parent memories if a row address of the defective cell is not stored in the parent memories and a column address of the defective cell is not stored in the parent memories at the time of detection of the defective cell,
    information about the defective cell is stored in one of the child memories corresponding to a first parent memory among the plurality of parent memories if a row address of the defective cell is stored in the first parent memory at the time of detection of the defective cell, and
    information about the defective cell is stored in one of the child memories corresponding to a second parent memory among the plurality of parent memories if a column address of the defective cell is stored in the second parent memory at the time of detection of the defective cell.

10. The device of claim 5, wherein
    the number of the parent memories is equal to Rs+Cs, and
    the number of the child memories is equal to Rs×(Cs−1)+Cs×(Rs−1), where Rs is the number of redundancy rows of the device and Cs is the number of redundancy columns of the device.

11. A method for storing error information of a memory device in a fault information storing device including a plurality of parent memories and a plurality of child memories, comprising:
    ignoring a defective cell if the defective cell belongs to a row or a column classified as a must repair;
    indicating that the row or column has been classified as a must repair in the parent memory storing the row or column, if the row or column of the defective cell is to be classified as a new must repair; and
    storing information about the defective cell in one of the parent memories or one of the child memories if the ignoring and the indicating operations are not performed.

12. The method of claim 11, wherein the indicating operation comprises:
    activating a row must-repair flag of the parent memory storing the row of the defective cell if the number of defective cells belonging to the row exceeds the number of redundancy columns; and
    activating a column must-repair flag of the parent memory storing the column of the defective cell if the number of defective cells belonging to the column exceeds the number of redundancy rows.

13. The method of claim 12, wherein the storing of the information about the defective cell comprises:
    storing information about the defective cell in one of the parent memories if a row address of the defective cell is not stored in the parent memories and a column address of the defective cell is not stored in the parent memories at the time of detection of the defective cell;
    storing information about the defective cell in one of the child memories corresponding to a first parent memory among the plurality of parent memories if a row address of the defective cell is stored in the first parent memory at the time of detection of the defective cell, and
    storing information about the defective cell in one of the child memories corresponding to a second parent memory among the plurality of parent memories if a column address of the defective cell is stored in the second parent memory at the time of detection of the defective cell.

14. The method of claim 11, wherein the ignoring, indicating, and storing operations are performed whenever a defective cell is detected.

15. A memory device, comprising:
    a memory cell array, comprising a plurality of memory cells arranged in rows and columns; and a fault information storing device configured to store row addresses and column addresses of defective memory cells and to store a row must-repair flag and a column must-repair flag, wherein the fault information storing device, comprises:

a parent memory, comprising:
- a first memory configured to store a row address;
- a second memory configured to store a column address; and
- a third memory configured to store the row must-repair flag and the column must-repair flag; and a child memory, comprising:
- a fourth memory configured to store a row address or a column address;
- a fifth memory configured to indicate whether the address stored in the fourth memory is a row address or a column address.

16. The memory device of claim 15, wherein the row must-repair flag indicates whether a row must be repaired and the column must-repair flag indicates whether a column must be repaired.

17. The memory device of claim 16, wherein the row must-repair flag and the column must-repair flag are each one bit.

* * * * *